(12) United States Patent
Mizuhara et al.

(10) Patent No.: US 6,777,665 B2
(45) Date of Patent: Aug. 17, 2004

(54) HIGH FREQUENCY OPTICAL SIGNAL SAMPLING DEVICE

(75) Inventors: Akira Mizuhara, Tama (JP); Norihide Yamada, Kokubungi (JP); Yasuhisa Kaneko, Kawasaki Kanagawa (JP)

(73) Assignee: Agilent Technologies, Inc., Palo Alto, CA (US)

( * ) Notice: Subject to any disclaimer, the term of this patent is extended or adjusted under 35 U.S.C. 154(b) by 129 days.

(21) Appl. No.: 10/198,327

(22) Filed: Jul. 16, 2002

(65) Prior Publication Data

US 2003/0020005 A1 Jan. 30, 2003

(30) Foreign Application Priority Data

Jul. 24, 2001 (JP) ........................................ 2001-223455

(51) Int. Cl.[7] .............................................. H01J 40/14
(52) U.S. Cl. .............................. 250/214 LS; 250/214.1
(58) Field of Search ..................... 250/214.1, 214 LS, 250/214 R, 214 SW; 398/12, 19, 45, 207; 455/3.04, 428; 356/221

(56) References Cited

U.S. PATENT DOCUMENTS 4,985,621 A * 1/1991 Aull et al. ............ 250/214 LS
5,920,065 A * 7/1999 Sun et al. ................. 250/214.1

OTHER PUBLICATIONS

110–Ghz, 59% Efficiency Mushroom–Mesa Waveguide p–i–n Photodiode for a 1/55 μm Wavelength Kato, et al, no date.

High efficiency edge–illuminatd unitravelling–carrier–structure refracting–facet photodiode Fukano, et al, no date.

PCT International Publication No. WO 97/21159.

Patent Abstracts of Japan, Publication No. 11142252 A—Shoichi.

Patent Abstracts of Japan, Publication No. 09043098 A—Koji, et al.

320 Gbit/s single–channel pseudo–linear transmission over 200 km of nonzero–dispersion fiber Raybon, et al, no date.

High–input power–allowable uni–travelling–carrier waveguide photodiodes with semi–insulating–InP buried structure—Yuda, et al, no date.

InP/InGaAs uni–travelling–cararier photodiode with 22—GHz bandwidth—Ito, et al, no date.

High–output–voltage, high speed, high efficiency uni–travelling–carrier waveguide photodiode Muramoto, et al, no date.

* cited by examiner

*Primary Examiner*—Que T. Le (57) ABSTRACT

An apparatus for converting an input optical signal to an electrical signal. The input optical signal is characterized by a modulation frequency and a modulation wavelength. The apparatus includes a photoconductive switch that is coupled to a photodetector by a common electrode. The photoconductive switch samples the output of the photodetector and is actuated by a switch light signal. The photoconductive switch and the photodetector are arranged such that the switch light signal does not interfere with the optical signal at locations proximate to the electrode and the electrode has a length that is less 0.5 mm.

18 Claims, 6 Drawing Sheets

HIGH FREQUENCY OPTICAL SIGNAL SAMPLING DEVICE

FIELD OF THE INVENTION

The present invention relates to devices for sampling optical signals that are modulated at high frequencies to provide an electrical signal having an amplitude related to the amplitude of the optical signal at the time the sample was taken.

BACKGROUND OF THE INVENTION

Modulated optical signals are utilized in a variety of communication applications. These signals typically consist of an optical carrier at a fixed carrier wavelength that is modulated to transmit data in the 1 to 10 Gb/sec range; however, data rates of over 300 Gb/sec have been reported. In the following discussion, the frequency at which the carrier is modulated will be referred to as the "modulation frequency". In systems that are bandwidth limited, the modulation frequency is the highest frequency component of the modulated signal. The modulation wavelength will be defined as nc/f, where c is the speed of light, n is the index of refraction of the relevant medium and f is the modulation frequency.

To diagnose communication links that utilize such optical signals, a device that converts the optical signal to an electrical signal that can be displayed on a conventional measurement device such as an oscilloscope is required. The simplest solution to this problem would be to convert the optical signal to an electrical signal by applying the light signal to a photodiode. However, conventional electrical measurement devices such as oscilloscopes cannot display signals that vary at the high modulation frequencies described above. Hence, devices that utilize sampling techniques to effectively shift the modulated signal to a lower frequency are utilized. Such devices sample the signal over a sampling time that is small compared to 1/f.

Prior art sampling devices typically utilize a photodetector that is connected in series with a photoconductive switch that is irradiated with a train of short light pulses. Each light pulse corresponds to one sample. Hence, the photoconductive switch samples the output of the photodetector to provide an electrical measurement signal that can be viewed on a conventional measurement device. In prior art devices, each of the photoconductive switch and photodetector is implemented as a photoconducting gap in a strip transmission line. The gaps are illuminated with the two light signals, and hence, the gaps must be separated by a distance that provides sufficient optical isolation to prevent the signal that actuates the photoconductive switch from reaching the gap corresponding to the photodetector and vice versa. The transmission lines are limited to about 1 mm. As the modulation frequency of the optical signal increases, the waveguide alters the potential measured at the photodetector. When the modulation wavelength approaches the distance between the photodetector and the photoconductive switch, a standing wave develops in the waveguide and hence, the potential at the photoconductive switch will differ from that at the photodetector. This difference in potential introduces errors in the sampled signal. As a result, prior art devices based on switch gaps in transmission lines have been limited to modulation frequencies below 20 GHz.

Broadly, it is the object of the present invention to provide an improved measurement device for sampling optical signals.

This and other objects of the present invention will become apparent to those skilled in the art from the following detailed description of the invention and the accompanying drawings.

SUMMARY OF THE INVENTION

The present invention is an apparatus for converting an input optical signal characterized by a modulation frequency and a modulation wavelength to an electrical signal. The apparatus includes a photoconductive switch that is coupled to a photodetector by a common electrode. The photoconductive switch includes a switch optical input, a first switch electrode, and a second switch electrode, the switch connecting the first switch electrode to the second switch electrode in response to a switch light signal received at the switch optical input. The photodetector includes a photodetector optical input for receiving the optical signal, a first photodetector electrode, and a second photodetector electrode, the photodetector causing a current to flow between the first and second photodetector inputs having a magnitude that depends on the intensity of the input optical signal. The connecting electrode connects the first switch electrode to the second photodetector electrode. The photoconductive switch and the photodetector are arranged such that the switch light signal does not interfere with the optical signal at locations proximate to the electrode and the electrode has a length less than 0.5 mm. The connecting electrode is preferably held at a fixed potential relative to the first photodetector electrode. In one embodiment, the connecting electrode is terminated to prevent reflections from occurring at the connecting electrode. The photodetector and the photoconductive switch are preferably integrated on a common substrate.

DETAILED DESCRIPTION OF THE PREFERRED EMBODIMENTS OF THE INVENTION

The embodiments of the present invention discussed below all include a light receiver that receives a modulated optical signal that is to be converted to an electrical signal and sampled to provide an output signal that can be measured utilizing a conventional electrical measurement apparatus. The optical signal is converted to an electrical signal by a photodetector in the light receiver. To simplify the following discussion, the light signal that is to be converted to an electrical signal will be denoted by "B". The output of the light receiver is sampled by a switch that is actuated by a second light signal denoted by "A".

Figure 1A:
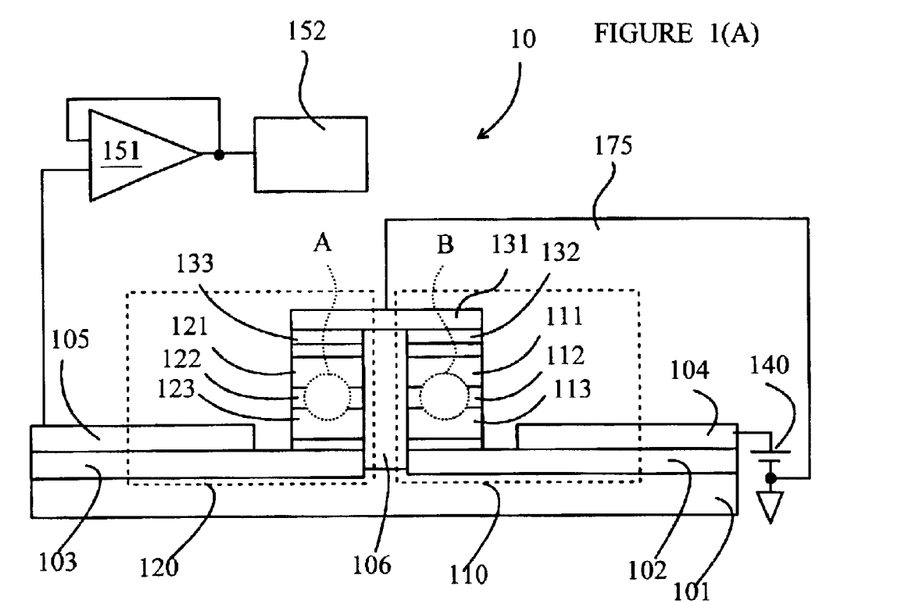
FIG. 1A is a side view of a first embodiment of an optical signal converter according to the present invention.
Figure 1B:
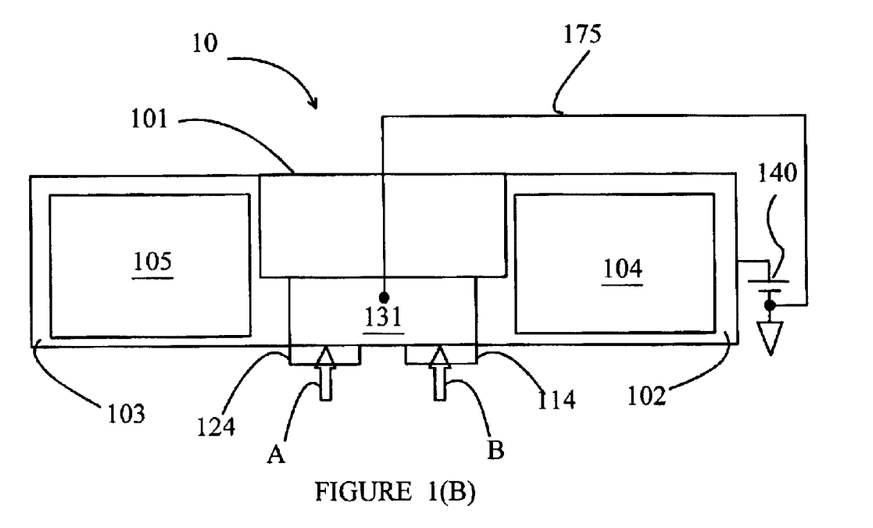
FIG. 1B is a top view of that signal converter.

The manner in which the present invention provides its advantages can be more easily understood with reference to FIGS. 1(A) and 1(B). FIG. 1(A) is a side view of a first embodiment of an optical signal converter according to the present invention, and FIG. 1(B) is a top view of that signal converter. Signal converter 10 has first and second light receivers 110 and 120 provided on a substrate 101. The first and second light receivers 110 and 120 have a p-i-n structure consisting of p layers 111 and 121, i layers 112 and 122, and n layers 113 and 123, respectively. The p layers 111 and 121, i layers 112 and 122, and n layers 113 and 123 preferably consist of p-InGaAsP cladding layers, i-InGaAs light absorbent layers, and n-InGaAsP cladding layers, respectively. The first light receiver 110 is connected to an electrode 104 via an $n^{++}$-InP contact layer 102 on the bottom side. As shown in the drawing, a DC bias 140 is applied to the electrode 104. The second light receiver 120 is connected to an electrode 105 via an $n^{++}$-InP contact layer 103. Electrode 105 is connected to an amplifier 151 and output buffer 152 that provide the electrical output signal.

Light receivers 110 and 120 are connected to a common electrode 131 via $p^{++}$-InP contact layers 132 and 133, respectively. An insulating barrier 106 extending in a direction perpendicular to the substrate is formed between light receivers 110 and 120. Insulating barrier 106 is preferably constructed from a material such as polyimide, and serves to electrically insulate the internal layers of light receivers 110 and 120 and to optically isolate the light receivers from one another. The top end of barrier 106 lies in the same plane as the top surfaces of the $p^{++}$-InP contact layers 132 and 133, and the common electrode 131 extends so as to bridge the $p^{++}$-InP contact layers 132 and 133.

The common electrode 131 is also connected to the grounded side of the DC bias 140 via conduction path 175. Grounding the common electrode prevents photo-carriers from accumulating on the common electrode. In general, the lead between common electrode 131 and the ground connection has sufficient inductance to isolate electrode 131 at the modulation frequency. However, if the present invention is to be utilized at frequencies at which this inductance does not provide sufficient isolation, additional impedance can be introduced between electrode 131 and ground by inserting a resistor between electrode 131 and ground.

The first and second receivers 110 and 120 must be optically isolated from one another to assure that the signal input to one of the receivers does not reach the optically active region of the other receiver. To improve the optical isolation between the receivers, antireflective coatings 114 and 124 are provided at the inputs to the optical receivers. Coatings 114 and 124 prevent any light reflected by one light receiver from being incident on the other receiver due to reflections at the light input ports.

The high-frequency optical signal to be measured B is incident on the DC-biased light receiver 110. Light receiver 110 functions as a high-speed photodetector in which carriers (electrons and holes) are generated by this optical signal, and the high-frequency optical signal is converted into a high-frequency electrical signal. While this embodiment of the present invention has been described in terms of a particular material system, any structure and material that provides an adequate response frequency band, signal to noise ratio, and linearity can be utilized.

Light receiver 120 is irradiated with a short light pulse string A having pulses with a width determined by the modulation frequency of signal B. Light receiver 120 functions as a high-speed photoconductive switch that is preferably switched on while being irradiated. The pulse period and delay between the pulses of signal A are chosen such that the high-frequency electrical signal generated by receiver 110 is converted into a low-frequency electrical signal that can be measured by a conventional signal measurement apparatus. While this embodiment of the present invention has been described in terms of a particular material system, any structure and material that provides an adequate response frequency band, signal to noise ratio, and linearity can be utilized to construct light receiver 120.

The optical carrier of the signal input to receiver 120 must have a wavelength that matches the optical absorption bands of the semiconductor material used in light receiver 120. The optical signal waveform of A is preferably as close to a delta function as possible. As long as these conditions are met, any light source may be utilized. For example, commercially available fiber mode lock lasers may be utilized. Such lasers have a peak output of about 10 kW with a waveform close to a Gaussian distribution, at a pulse width of about 200 fs at a wavelength of 1550 nm. Such sources are well matched to a high-speed photoconductive switch made from GaInAs.

The size of electrode 131 is chosen to prevent standing waves from forming in the electrode. The size of the common electrode 131 is preferably substantially smaller than the modulation wavelength of signal B. In particular, the electrode should be no more than one-fourth, and preferably one-tenth of the modulation wavelength of signal B. In addition, electrode 131 is preferably grounded. At modulation frequencies above about 20 GHz, the modulation wavelength is less than 5 mm; hence, the electrode is preferably less than 0.5 mm. As a result, a distance that is less than 0.5 mm preferably separates the optical switching elements.

In this embodiment of the present invention, light receivers 110 and 120 are formed such that the light receivers face in the same direction. Hence, light receivers 110 and 120 can be formed from a common set of semiconductor layers. In particular, light converter 10 can be fabricated by depositing crystalline layers on substrate 101 and etching away part of the two p-i-n photodiode structures down to the $n^{++}$-InP contact layer by a dry etching process to separate the p-i-n photodiodes. The gap between the two diodes is then filled with material such as polyimide to reduce parasitic capacitance. The common electrode is then deposited on the structure.

Figure 2:
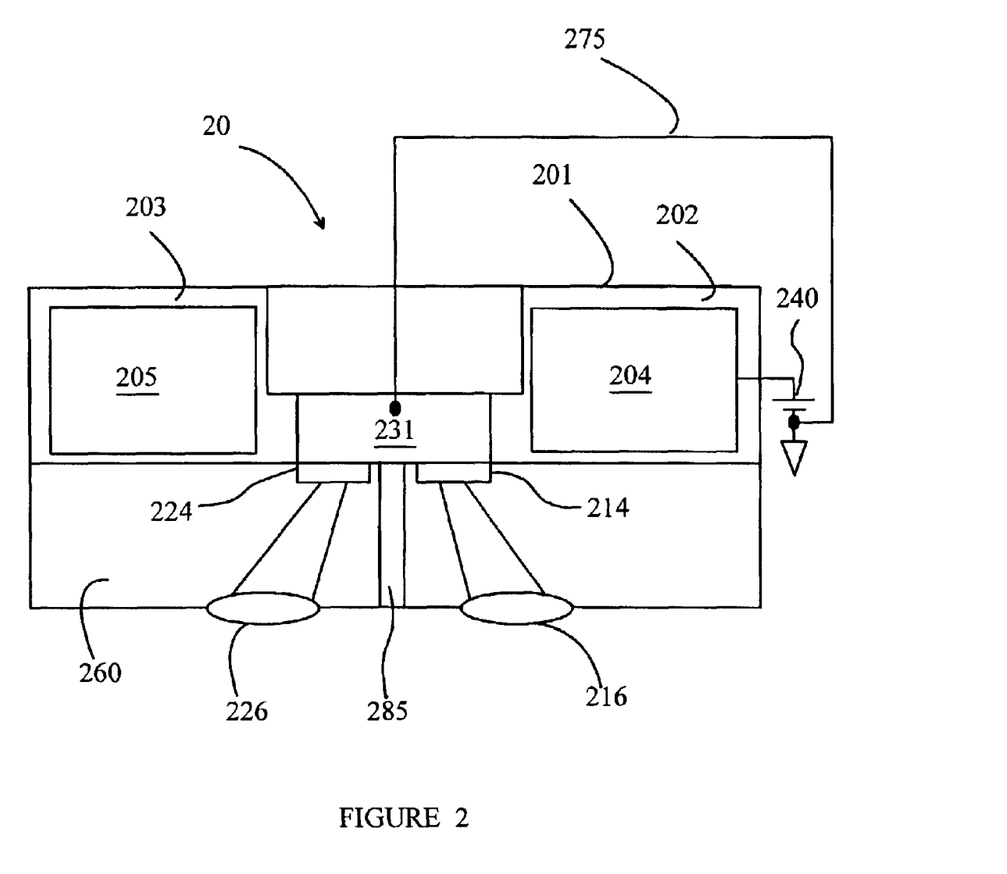
FIG. 2 is a top view of a light converter 20 according to a second preferred embodiment of the present invention.

Refer now to FIG. 2, which is a top view of a light converter 20 according to a second preferred embodiment of the present invention. To simplify the discussion, those structural components that have the same function as components discussed above with reference to FIG. 1 have reference numerals that are 100 larger than the numbers used in FIG. 1 for the corresponding components. Light converter 20 differs from light converter 10 in that optical elements 216 and 226 are provided for concentrating the input light signals onto the light receivers. In addition, a light barrier 285 isolates the inputs to the light receivers. Optical elements 216 and 226 and light barrier 285 are preferably assembled on the same base or substrate 260.

Figure 3A:
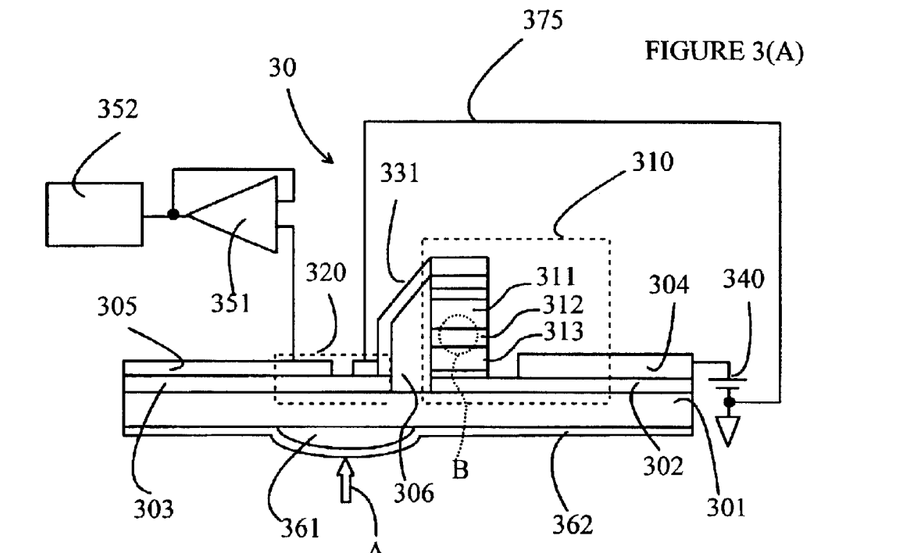
FIG. 3A is a side view of optical converter 30.
Figure 3B:
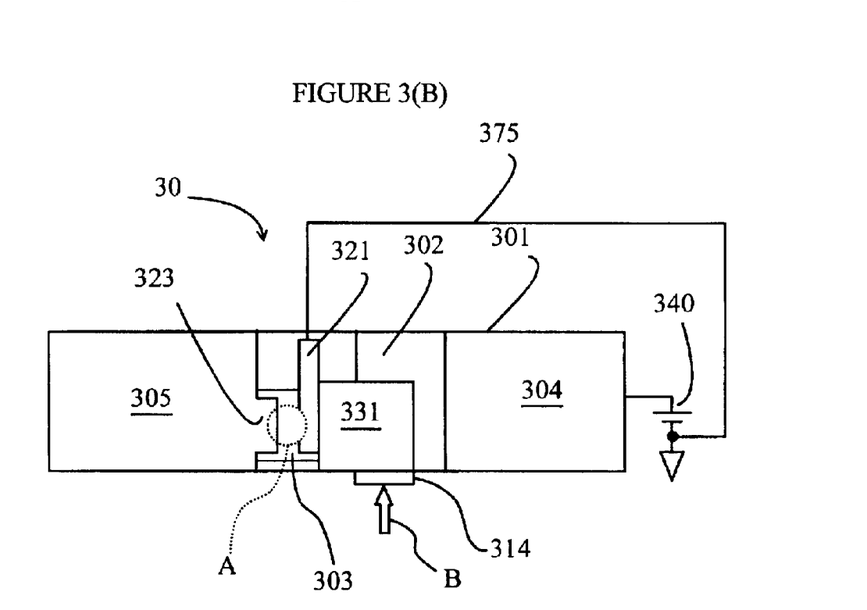
FIG. 3B is a top view of optical converter 30.

Refer now to FIGS. 3(A) and 3(B), which illustrate a third preferred embodiment of the present invention. FIG. 3(A) is a side view of optical converter 30, and FIG. 3(B) is a top view of optical converter 30. To simplify the discussion, those structural components that have the same function as components discussed above with reference to FIG. 1 have reference numerals that are 200 larger than the numbers used in FIG. 1 for the corresponding components. In contrast to optical converter 10, optical converter 30 is structured such that optical signal B is received from the lateral direction, whereas the sampling light pulse signal A is received from the bottom side of substrate 301.

Optical converter 30 is similar to optical converter 10 in that a first light receiver 310 that receives signal B has a p-i-n laminate structure consisting of a p layer (such as a p-InGaAsP cladding layer) 311, an i layer (such as an i-InGaAs absorption layer) 312, and an n layer (such as an n-InGaAsP cladding layer) 313. A second light receiver 320 includes an MSM (Metal-Semiconductor-Metal) structure consisting of a pair of electrode components 321 and 323 and an i layer 303 such as an i-GaAs absorption layer formed by the etching of metal wiring 305. The second light receiver includes a converging optical assembly 361 having a lens for assuring that signal A received on the bottom of the substrate 301 will be effectively guided to this MSM structure. The surfaces of light receivers 310 and 320 that receive the optical signals include antireflective coatings 314 and 362.

Optical converter 30 can provide a smaller common electrode than that of optical converter 10 to prevent standing waves from appearing in the electrode. In addition, optical converter 30 has better isolation between signals A and B because the signals travel at right angles to one another.

Figure 4A:
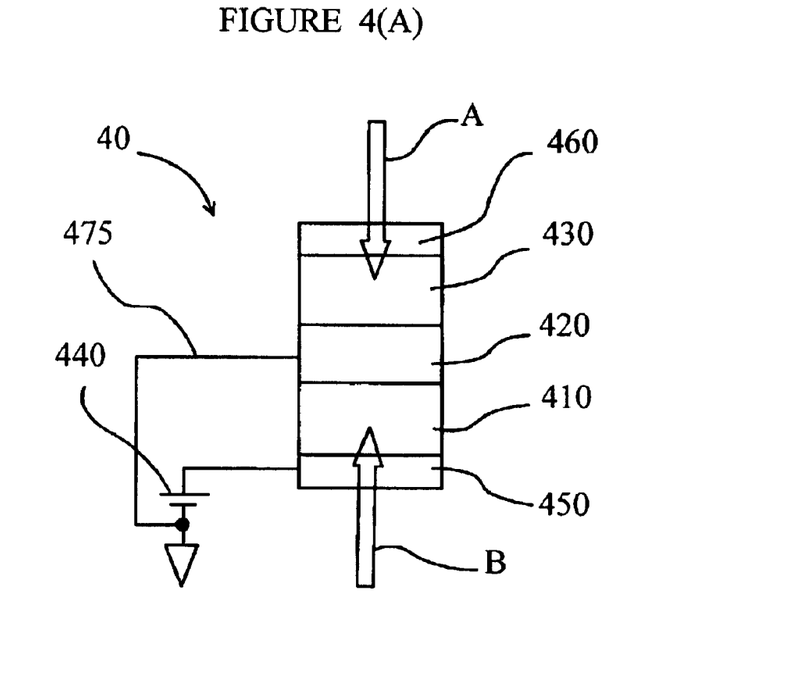
FIGS. 4A and 4B illustrate a fourth preferred embodiment of the present invention.
Figure 4B:
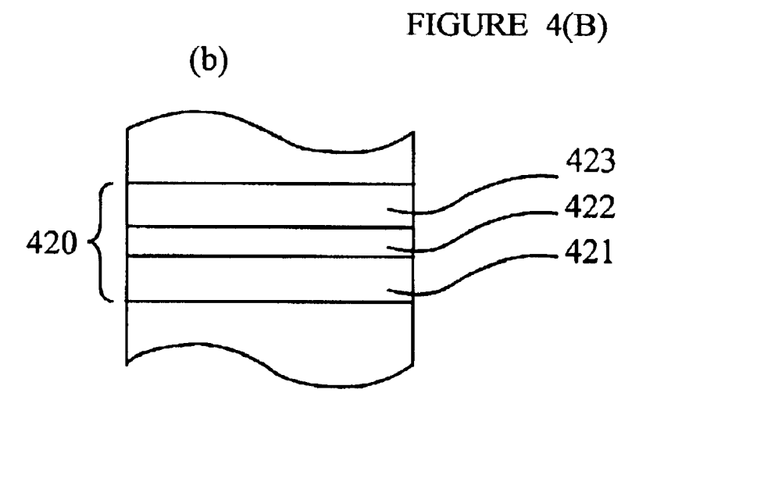

Refer now to FIGS. 4(A) and 4(B), which illustrate a fourth preferred embodiment of the present invention. Optical converter 40 includes a first light receiver 410 for receiving the optical signal B and a second light receiver 430 for receiving signal A. The receivers are coupled back to back, with a common electrode 420 sandwiched between the receivers. In this embodiment, signals A and B are incident from opposite directions. Transparent electrodes 450 and 460 are provided at the outer ends of the two light receivers 410 and 430, and a DC bias 440 is applied to light receiver 410. Electrodes 450 and 460 are formed from a transparent conducting material such as indium tin oxide (ITO) or a low electrical resistance layer of semiconductor that is transparent to signals A and B.

Referring to FIG. 4(A), electrode 420 is preferably reflective at the wavelengths of optical signals A and B. Electrode 420 can be constructed from one or more metal layers having sufficient thickness to adequately reflect signals A and B. In addition, layer 420 has a thickness that is small compared to the modulation wavelength of signal B. This maximum thickness should be no more than about one-fourth, and preferably one-tenth of the modulation wavelength.

In another example, electrode 420 can be a distributed Bragg reflector (DBR) constructed from layers of a low electrical resistance semiconductor material or the like that has been doped to provide the desired conductivity and indices of refraction. The DBR is constructed to reflect signal A, while having a thickness that is sufficiently less than the modulation wavelength of signal B.

Refer now to FIG. 4(B), which is a cross-sectional view of another example of an electrode 420. In this embodiment, electrode 420 is constructed from a layered structure comprising two DBRs separated by a conducting layer. DBR 421 is designed to reflect the carrier wavelength of signal B. The conductive layer 422 is made of metal or other low electrical resistance material, and DBR 423 is designed to reflect signal A. The overall thickness of these layers is preferably less than the modulation wavelength of signal B.

In operation, light receiver 410 functions as a photodetector, and light receiver 430 functions as a high-speed photoconductive switch. The reflective common electrode 420 assures that signals A and B do not interfere with each other. Electrode 420 is preferably made small enough in size to prevent a standing wave from appearing in the electrode. The electrode 420 is also grounded through wiring 475 to prevent holes or electrons from accumulating on the electrode.

Figure 5:
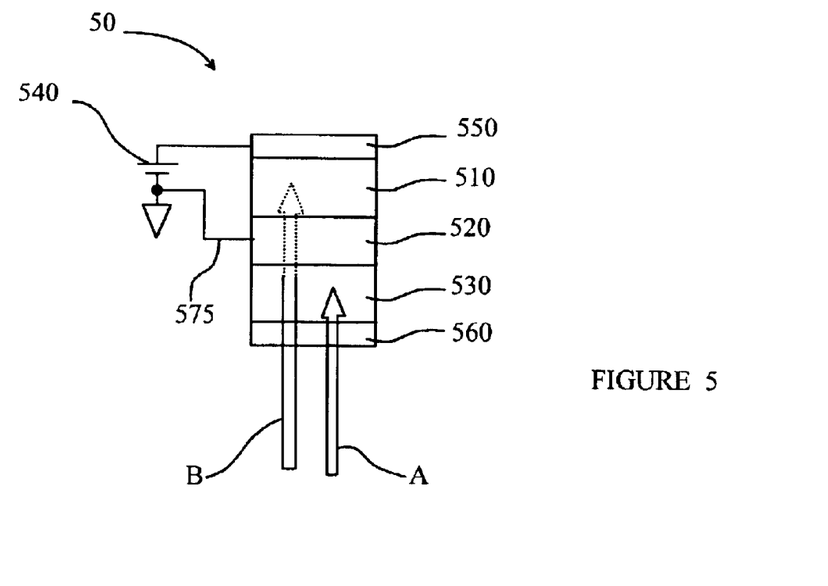
FIG. 5 illustrates a fifth preferred embodiment of the present invention.

Refer now to FIG. 5, which illustrates a fifth preferred embodiment of the present invention. Optical converter 50 is similar to optical converter 40 discussed above in that it includes first and second light receivers shown at 510 and 530 sandwiching an electrode 520, and electrodes 550 and 560 at the outer ends thereof. Electrode 560 must be transparent to both signals A and B. The electrodes 550 and 560 can be made of the same materials discussed above with respect to optical converter 40. A DC bias is applied to the light receiver 510 and the common electrode is grounded for the reasons discussed above.

However, optical converter 50 differs from optical converter 40 in that the light signals are received from the same side. The signals A and B are both incident on optical converter 50 from the second light receiver side. Optical signals A and B have different carrier wavelengths. The material used to construct the photoconductive switch is chosen such that optical signal B is able to pass through the photoconductive switch. This is accomplished by selecting the semiconductor material that makes up light receiver 530. Denote the carrier wavelength of optical signal B by $\lambda 1$ and the wavelength of the carrier for optical signal A by $\lambda 2$. The carrier for signal A is chosen such that $\lambda 1 > \lambda 2$. The material from which the optical switch is constructed is chosen such that the absorbency at $\lambda 1$ is low while the absorbency at $\lambda 2$ is high.

In this embodiment, electrode 520, which is sandwiched between light receivers 510 and 530, must also be transparent to light having a wavelength of $\lambda 1$. In the preferred embodiment of the present invention, electrode 520 also absorbs light of wavelength $\lambda 2$. Such an electrode can be constructed from a doped semiconductor with the appropriate bandgap.

The embodiment shown in FIG. 5 was designed such that the optical signal to be measured passed through the optical switch and was converted to an electrical signal in the photodetector in receiver 510. However, embodiments having the opposite geometry can be practiced. In this case, signals A and B would both be incident on electrode 550, and the photodetector would be chosen to be transparent to signal A.

Figure 6:
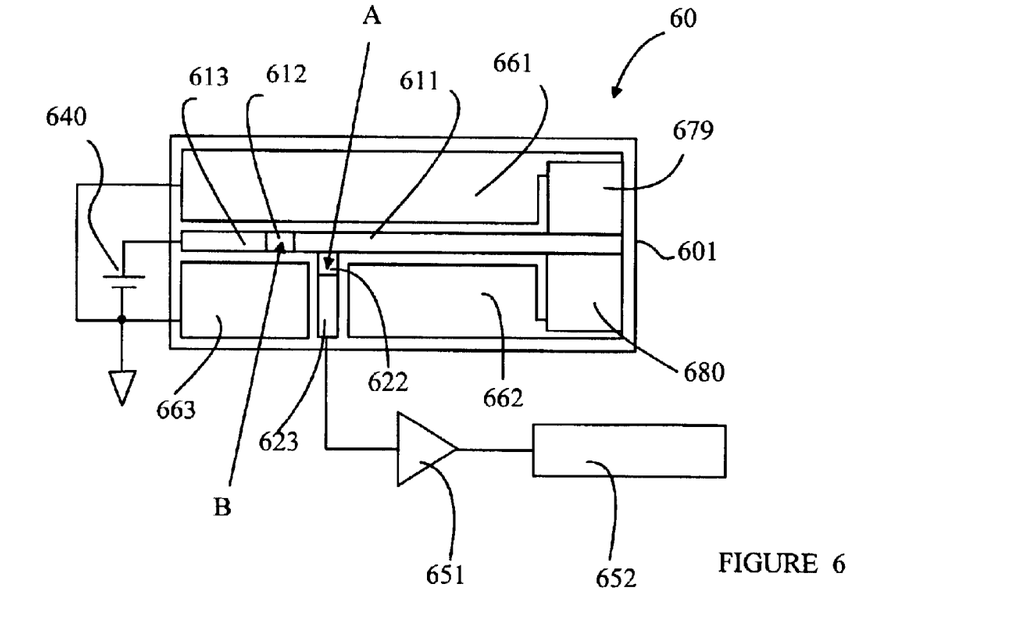
FIG. 6 illustrates a high-frequency optical signal converter 60 according to another preferred embodiment of the present invention.

Refer now to FIG. 6, which illustrates a high-frequency optical signal converter 60 according to another preferred embodiment of the present invention. Converter 60 includes a first light receiver 612 that receives the optical signal B and a second light receiver 622 that receives signal A. Receiver 612 functions as a high-speed photodetector, and receiver 622 functions as a high-speed photoconductive switch. The two receivers are integrated on a single substrate 601. Light receiver 612 is located between conductors 611 and 613, and light receiver 622 is connected to conductor 623. The distance between the two light receivers 612 and 622 is shorter than the modulation wavelength of signal B. In addition to conductors 611, 613, and 623, grounding pads 661, 662, and 663 are formed on the substrate 601, thereby forming a coplanar transmission line. A DC bias, generated by source 640, is applied to light receiver 612. A buffer circuit 651 that receives the output from the second light receiver, and an A/D converter 652 connected to the output of the buffer circuit provide a digital output signal.

This embodiment of the present invention includes terminators 679 and 680 that are integrally formed on substrate 601. These terminators are thin film resistors that link conductor 611 to the grounding pads 661 and 662. The resistors are preferably formed by printing on the surface of substrate 601. This arrangement ensures that a DC bias will be applied to the coplanar circuit.

Figure 7:
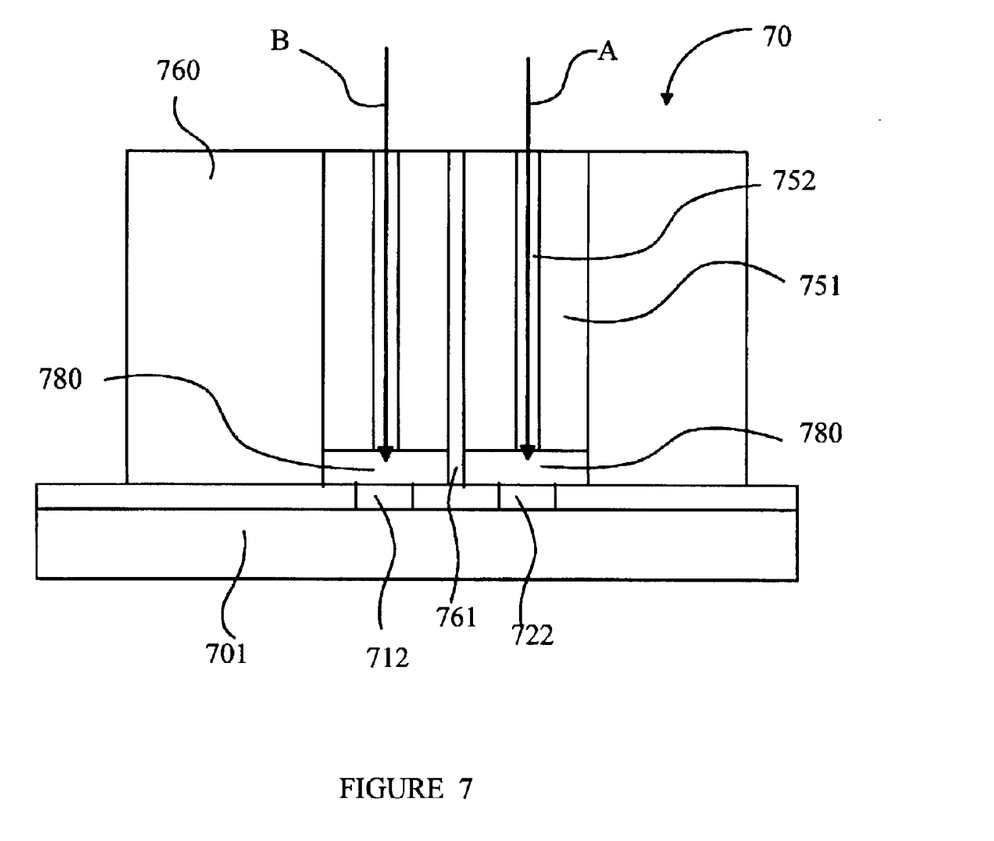
FIG. 7 is a cross-sectional view of a high-frequency optical signal converter 70 according to another preferred embodiment of the present invention.

Refer now to FIG. 7, which is a cross-sectional view of a high-frequency optical signal converter 70 according to another preferred embodiment of the present invention. In this embodiment, signal A and signal B are both received in a direction that is perpendicularly incident on a substrate 701. Converter 70 includes a first light receiver 712 that receives optical signal B, and a second light receiver 722 that receives optical signal A. These receivers are integrated on substrate 701. Receiver 70 also includes a pair of waveguide structures including a core component 752 and a cladding component 751 that are aligned with these light receivers. Optical signals A and B are guided along their corresponding waveguide structures to light receivers 712 and 722. The distance between light receivers 712 and 722 is made substantially less than the wavelength of the generated electrical signal from optical signal B for the reasons discussed above. It should be noted that employing waveguide structures extending perpendicularly to the substrate shortens the distance between light receivers 712 and 722 while separating signals A and B in a manner that prevents these signals from interfering with one another while still providing the desired separation between the receivers. The common electrode in the two light receivers is also grounded for the reasons discussed above. To simplify the drawings, the bias and signal processing circuitry as well as the electrode that connects light receivers 712 and 720 has been omitted from FIG. 7.

Converter 70 also includes an alignment member 760 fixed on substrate 701 that keeps the waveguide structures properly aligned. An adhesive agent 780 having a suitable refractive index is disposed between the waveguide structures and light receivers 712 and 722 to prevent optical losses at the interface of the waveguides and the receivers. A barrier 761 that prevents light from leaking from one light receiver to the other separates the two waveguides.

Various modifications to the present invention will become apparent to those skilled in the art from the foregoing description and accompanying drawings. Accordingly, the present invention is to be limited solely by the scope of the following claims.

What is claimed is:

1. An apparatus for converting an input optical signal characterized by an input modulation frequency and a modulation wavelength to an output electrical signal, said apparatus comprising:
a photodetector for converting said optical input signal to an electrical signal on a connecting electrode, said electrical signal having a modulation frequency equal to said input modulation frequency; and
a photoconductive switch connecting an output circuit to said connecting electrode, said photoconductive switch being operative in response to a switch optical signal wherein,
said connecting electrode having a light less than 0.5 mm.

2. The apparatus of claim 1 wherein said connecting electrode is connected to a bias terminal that is held at a fixed DC potential, said connection being made through a conductor having sufficient impedance at said modulation frequency to isolate said connecting electrode from said bias terminal at said modulation frequency.

3. The apparatus of claim 1 wherein said connecting electrode is terminated to prevent electrical reflections from occurring at said connecting electrode.

4. The apparatus of claim 1 further comprising a barrier for optically isolating said photodetector from said photoconductive switch.

5. The apparatus of claim 1 wherein said photodetector and said photoconductive switch are integrated on a common substrate.

6. The apparatus of claim 1 wherein said photoconductive switch comprises a switch optical input for receiving said switch optical signal and wherein said switch optical input comprises an antireflecting coating.

7. The apparatus of claim 1 wherein said photodetector comprises a photodetector optical input for receiving said input optical signal and wherein said photodetector optical input comprises an antireflecting coating.

8. The apparatus of claim 1 wherein said photoconductive switch comprises a switch optical input for receiving said switch optical signal and wherein said switch optical input comprises an optical element for causing said switch optical signal to converge onto a light-sensitive layer in said photoconductive switch.

9. The apparatus of claim 1 wherein said photodetector comprises a photodetector optical input for receiving said input optical signal and wherein said photodetector optical input comprises an optical element for causing said optical signal to converge onto a light-sensitive layer in said photodetector.

10. The apparatus of claim 1 wherein said photodetector comprises a photodetector optical input for receiving said optical signal, a fist photodetector electrode, and a second photodetector electrode, said photodetector causing a current to flow between said first and second photodetector inputs having a magnitude that depends on the intensity of said input optical signal, wherein said photoconductive switch comprises a switch optical input, a first switch electrode, and a second switch electrode, said photoconductive switch connecting said first switch electrode to said second switch electrode in response to a switch light signal received at said switch optical input, and wherein said photodetector and said photoconductive switch are disposed so as to sandwich said connecting electrode.

11. The apparatus of claim 10 wherein said switch optical input and said photodetector optical input are on opposite sides of said connecting electrode.

12. The apparatus of claim 1 wherein said photoconductive switch comprising a switch optical input, a first switch electrode, and a second switch electrode, said switch connecting said first switch electrode to said second switch electrode in response to a switch light signal received at said switch optical input, and wherein said second switch electrode is transparent to said switch optical signal.

13. The apparatus of claim 1 wherein said photodetector comprises a photodetector optical input for receiving said optical signal, a first photodetector electrode, and a second photodetector electrode, said photodetector causing a current to flow between said first and second photodetector inputs having a magnitude that depends on the intensity of said input optical signal and wherein said first photodetector electrode is transparent to said input optical signal.

14. The apparatus of claim 10 wherein one of said first switch electrode and said second photodetector electrode comprises a Bragg reflector for reflecting one of said input optical signal end said switch optical signal.

15. The apparatus of claim 10 wherein said first switch electrode and said second photodetector electrode comprise Bragg reflectors, one of said Bragg reflectors reflecting said input optical signal and the other of said Bragg reflectors reflecting said switch optical signal.

16. The apparatus of claim 10 wherein said second electrode of said photoconductive switch is transparent, wherein said connecting electrode is transparent, and wherein said input optical signal and said switch optical signal pass through said second electrode of said photoconductive switch, said input optical signal passing through said photoconductive switch without causing said photoconductive switch to form a conducting path between said first and second electrodes of said photoconductive switch.

17. The apparatus of claim 1 wherein said optical input signal enters said apparatus in substantially the same direction that said switch optical signal enters said apparatus.

18. The apparatus of claim 1 wherein said input optical signal enters said apparatus in a direction this is substantially at right angles to the direction that said switch optical signal enters said apparatus.

* * * * *